United States Patent
Qian et al.

(10) Patent No.: US 10,875,144 B2
(45) Date of Patent: Dec. 29, 2020

(54) CHEMICAL MECHANICAL POLISHING PAD

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Fengji Yeh, Hsinchu (TW); Te-Chun Wang, Taipei (TW); Sheng-Huan Tseng, Hsinchu (TW); Kevin Wen-Huan Tung, Taichung (TW); Marty W. DeGroot, Middletown, DE (US)

(73) Assignee: ROHM AND HAAS ELECTRONIC MATERIALS CMP HOLDINGS, I, Newark, DE (US)

( * ) Notice: Subject to any disclaimer, the term of this patent is extended or adjusted under 35 U.S.C. 154(b) by 150 days.

(21) Appl. No.: 16/058,757

(22) Filed: Aug. 8, 2018

(65) Prior Publication Data

US 2018/0361531 A1    Dec. 20, 2018

Related U.S. Application Data

(62) Division of application No. 15/476,404, filed on Mar. 31, 2017, now abandoned.

(51) Int. Cl.
*B24B 37/24* (2012.01)
*C08G 18/10* (2006.01)
*H01L 21/321* (2006.01)
*C08G 18/32* (2006.01)
*C08G 18/66* (2006.01)

(52) U.S. Cl.
CPC .............. *B24B 37/24* (2013.01); *C08G 18/10* (2013.01); *C08G 18/3203* (2013.01); *C08G 18/3225* (2013.01); *C08G 18/6611* (2013.01); *H01L 21/3212* (2013.01)

(58) Field of Classification Search
CPC .... B24B 37/24; C08G 18/10; C08G 18/3203; C08G 18/3225; C08G 18/6611
See application file for complete search history.

(56) References Cited

U.S. PATENT DOCUMENTS

| | | |
|---|---|---|
| 5,618,381 A | 4/1997 | Doan et al. |
| 6,953,388 B2 | 10/2005 | Shimagaki et al. |
| 8,697,239 B2 | 4/2014 | Kulp et al. |
| 8,980,749 B1 | 3/2015 | Rai et al. |
| 8,993,648 B2 | 3/2015 | Nakai et al. |
| 9,064,806 B1* | 6/2015 | Qian ..................... H01L 21/304 |
| 9,144,880 B2 | 9/2015 | Qian et al. |
| 9,238,295 B2 | 1/2016 | Qian et al. |
| 9,452,507 B2 | 9/2016 | Qian et al. |
| 2002/0098778 A1 | 7/2002 | Takashima et al. |
| 2012/0202409 A1* | 8/2012 | Shinchi ................... B24B 37/24 451/526 |
| 2015/0306731 A1* | 10/2015 | Qian ...................... B24B 37/24 51/298 |
| 2018/0148537 A1* | 5/2018 | Barton ..................... B24B 37/20 |

\* cited by examiner

*Primary Examiner* — Michael L Leonard
(74) *Attorney, Agent, or Firm* — Blake T. Biederman; Andrew Merriam

(57) ABSTRACT

The present invention provides methods of CMP polishing a metal surface, such as a copper or tungsten containing metal surface in a semiconductor wafer, the methods comprising CMP polishing the substrate with a CMP polishing pad that has a top polishing surface in a polishing layer which is the reaction product of an isocyanate terminated urethane prepolymer and a curative component comprising a polyol curative having a number average molecular weight of 6000 to 15,000, and having an average of 5 to 7 hydroxyl groups per molecule and a polyfunctional aromatic amine curative, wherein the polishing layer would if unfilled have a water uptake of 4 to 8 wt. % after one week of soaking in deionized (DI) water at room temperature. The methods form coplanar metal and dielectric or oxide layer surfaces with low defectivity and a minimized degree of dishing.

8 Claims, No Drawings

CHEMICAL MECHANICAL POLISHING PAD

This application is a divisional of U.S. Ser. No. 15/476,404, filed Mar. 31, 2017, now pending.

The present invention relates to methods comprising chemical mechanical polishing (CMP polishing) to planarize a metal surface in a semiconductor wafer, magnetic or optical substrate and thereby forming coplanar metal and dielectric layer surfaces with low defectivity and a minimized degree of dishing, as well as to CMP polishing pads used in the methods. More particularly, the present invention relates to methods wherein CMP polishing comprising polishing the semiconductor wafer, memory or optical substrate with a CMP polishing pad comprising the polyurethane a reaction product of an isocyanate terminated urethane prepolymer and a curative component comprising from 60.3 to 70 wt. %, of a polyol curative, having a number average molecular weight of 6000 to 15,000 and an average of 5 to 7 hydroxyl groups per molecule.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques, e.g. physical vapor deposition (PVD), also known as sputtering, chemical vapor deposition (CVD), plasma-enhanced chemical vapor deposition (PECVD) and electrochemical plating. As layers of materials are sequentially deposited and removed, the uppermost surface of the wafer becomes non-planar and must be planarized to enable effective deposition of subsequent layers on the wafer. Accordingly, each deposited layer is planarized by chemical mechanical planarization, or chemical mechanical polishing (CMP polishing). Thus, CMP polishing is useful for removing undesired surface topography and surface defects, such as rough surfaces, agglomerated materials, crystal lattice damage, scratches and contaminated layers or materials.

Metal layers are deposited on the semiconductor wafer to form conductive pathways as metal contacts and interconnects for multilevel metallization of semiconductor integrated circuits. Metals may be deposited as layers, such as to fill trenches or troughs, fill post holes, or to include micro- or nano-scale conductive circuitry; and metals may be deposited in larger features of the semiconductor, such as buses and bond pads. However, in the CMP polishing of softer or more ductile metals, such as copper, the metals can be removed in a non-planar fashion, such as dishing. The term "dishing" refers to a phenomenon wherein CMP polishing results in a metal recess in a low area, such as an oxide cavity or trough, where the metal layer should, but does not remain planar or coplanar with lower layers of the substrate wafer after CMP polishing.

The dishing problem has become more prominent in recent years as semiconductor wafers and devices are becoming increasingly complex, with finer features and more metallization layers. This trend requires improved performance from polishing consumables (pads and slurries) to maintain planarity and limit polishing defects. Defects in such wafers and devices can create electrical breaks or shorts in the conducting lines that would render the semiconductor device inoperative. It is generally known that one approach to reduce polishing defects, such as microscratches or chatter marks, is to use a softer polishing pad. Further, CMP polishing of soft metal layers may necessitate the use of softer CMP polishing pads. However, while CMP polishing with a soft pad can improve defectivity in substrates polished using such pads, such soft pads can increase dishing in metallized semiconductor wafer surfaces due to the flexible nature of the soft pad.

U.S. patent publication no. US2015/0306731 A1, to Qian et al., discloses CMP polishing pads which are the reaction product of a polyisocyanate prepolymer and a curative containing less than 60 wt. % of a high molecular weight polyol curative having an average of 3 to 10 hydroxyl groups and more than 40% of a difunctional curative selected from diols and diamines. Qian et al. fails to disclose methods of CMP polishing ductile metals and softer substrates. Further, Qian fails to disclose any CMP polishing pad that provides a solution to the problem of dishing in metallized semiconductor wafer surfaces. Accordingly, there remains a need for a metal CMP polishing pad and metal CMP polishing method that enables reduced defectivity and improved dishing performance.

The present inventors have sought to solve the problem of enabling the CMP polishing of metal surfaces in semiconductor wafer or device substrates to provide reduced defectivity and, at the same time, reduced dishing of the metal on the substrate surface.

STATEMENT OF THE INVENTION

In accordance with the present invention, methods of CMP polishing a metal surface in a semiconductor wafer, magnetic or optical substrate comprise CMP polishing the substrate with a CMP polishing pad that has a top polishing surface in a polishing layer, the polishing layer comprising: a reaction product of an isocyanate terminated urethane prepolymer having 8.5 to 9.5 wt. % or, preferably, from 8.95 to 9.25 wt. % of unreacted NCO groups; and a curative component comprising from 60.3 to 70 wt. %, or, preferably, 60.5 to 67 wt. %, or, more preferably, 60.6 to 65 wt. %, based on the solids weight of the curative component, of a polyol curative, having a number average molecular weight of 6000 to 15,000, or, preferably, from 10,000 to 13,000, and having an average of 5 to 7 or, preferably, 6 hydroxyl groups per molecule; and from 30 to 39.7 wt. %, preferably, 33 to 39.5 wt. % or, more preferably, 35 to 39.4 wt. %, based on the solids weight of the curative component, of a polyfunctional aromatic amine curative, such as a difunctional curative, preferably, 4,4' methylene bis (2 chloroaniline) (MBOCA), 4,4' methylene bis (3 chloro 2,6 diethylaniline) (MCDEA), diethyltoluenediamine (DETDA); 3,5 dimethylthio 2,4 toluenediamine (DMTDA), isomers thereof, or mixtures thereof, wherein the polishing layer would if unfilled or lacking in added porosity have a water uptake of 4 to 8 wt. % after one week of soaking in deionized (DI) water at room temperature and a Shore D hardness ranging of from 28 to 64, or, preferably, from 30 to 60 or, more preferably, from 35 to 55, the top polishing surface adapted to planarize and polish the metal surface in the substrate and thereby forming coplanar metal and dielectric or oxide layer surfaces with low defectivity and a minimized degree of dishing.

In accordance with the methods of the present invention, the methods comprise CMP polishing a substrate with a polishing layer wherein the polishing layer comprises a reaction product wherein the stoichiometric ratio of the reactive hydrogen groups (defined as the sum of $NH_2$ and OH groups) in the curative component to the unreacted NCO groups in the isocyanate terminated urethane prepolymer ranges from 0.85:1 to 1.15:1, or, preferably from 1.02:1 to 1.08:1.

In accordance with the methods of the present invention, the methods comprise CMP polishing a copper or tungsten containing metal surface in a semiconductor wafer, preferably, a copper containing surface, such as a bulk copper surface, a copper barrier surface.

In accordance with the methods of the present invention, the methods comprise CMP polishing with a CMP polishing pad having a polishing layer that consists essentially of the reaction product of a curative component that has 5 wt. % or less or that is substantially free of any diol, such as polytetramethylene glycol (PTMEG), poly(propylene glycol) PPG, 1,4-butane diol, ethylene glycol, diethylene glycol, or their mixtures. The term "substantially free of any diol" means that the curative component comprises 2,000 ppm or less or, preferably, 1,000 ppm or less of any diol.

In accordance with the methods of the present invention, the methods comprise CMP polishing a substrate with a CMP polishing pad having a polishing layer that has a specific gravity (SG) of from 0.4 to 1.15 or, preferably, from 0.6 to 1.1 or, more preferably, from 0.7 to 1.0. In accordance with these methods, the methods comprise CMP polishing with a CMP polishing pad that comprises a polishing layer wherein the reaction product which, when unfilled or lacking in added porosity, would have an SG of from 1.0 to 1.3 or, preferably, from 1.1 to 1.2.

In accordance with the methods of the present invention, the methods comprise CMP polishing with a CMP polishing pad having a polishing layer that comprises gas filled or hollow microelements, such as, preferably, polymeric microspheres from which the CMP polishing derives its porosity. Preferably, the amount of such gas filled or hollow microelements ranges from 0 to 5 wt. %, or, preferably, from 1.5 to 3 wt. %, based on the solids weight of the polishing layer.

In accordance with the methods of the present invention, the CMP polishing comprises: providing a CMP polishing apparatus having a platen; providing at least one substrate to be polished; providing a CMP polishing pad of the present invention; installing onto the platen the CMP polishing pad; optionally, providing a polishing medium at an interface between a polishing surface of the CMP polishing pad and the substrate, preferably, wherein the polishing medium is selected from the group consisting of a polishing slurry and a non-abrasive containing reactive liquid formulation; and, creating dynamic contact between the polishing surface and the substrate, wherein at least some material is removed from the substrate.

In accordance with the methods of the present invention, the methods comprise CMP polishing with the CMP polishing pad of the present invention and, further comprise: providing a polishing medium at an interface between the polishing surface and the substrate; and, creating dynamic contact between the polishing surface and the substrate, such as by rotating the substrate, rotating the CMP polishing pad having the polishing layer, or rotating both, wherein at least some material is removed from the substrate.

In accordance with the methods of the present invention, the methods comprise: CMP polishing with the CMP polishing pad of the present invention and, separately or at the same time, conditioning the polishing layer of the CMP polishing pad with a conditioning disk so that the CMP polishing pad has a surface microtexture.

In another aspect of the present invention, CMP polishing pads comprise a polishing layer which is a reaction product of an isocyanate terminated urethane prepolymer having 8.5 to 9.5 wt. % unreacted NCO groups; and a curative component comprising from 60.3 to 70 wt. %, or, preferably, 60.5 to 67 wt. %, or, more preferably, 60.6 to 65 wt. %, based on the solids weight of the curative component, of a polyol curative, having a number average molecular weight of 6000 to 15,000, or, preferably, from 10,000 to 13,000, and an average of 5 to 7 or, preferably, 6 hydroxyl groups per molecule; and 30 to 39.7 wt. %, preferably, 33 to 39.5 wt. %, or, more preferably, 35 to 39.4 wt. %, based on the solids weight of the curative component, of a polyfunctional aromatic amine curative, such as a difunctional curative, preferably, 4,4' methylene bis (2 chloroaniline) (MBOCA), 4,4' methylene bis (3 chloro 2,6 diethylaniline) (MCDEA), diethyltoluenediamine (DETDA); 3,5 dimethylthio 2,4 toluenediamine (DMTDA), isomers thereof, or mixtures thereof, wherein the polishing layer would if unfilled or lacking in added porosity have a water uptake of 4 to 8 wt. % after one week of soaking in deionized (DI) water at room temperature and a Shore D hardness as measured according to ASTM D2240-15 (2015) ranging of from 28 to 64, or, preferably, from 30 to 60 or, more preferably, from 35 to 55, the top polishing surface adapted to planarize and polish the metal surface in the substrate and thereby forming coplanar metal and dielectric or oxide layer surfaces with low defectivity and a minimized degree of dishing.

In accordance with the CMP polishing pads of the present invention, the CMP polishing pad has a polishing layer that consists essentially of the reaction product of a curative component that has 5 wt. % or less or that is substantially free of any diol, such as polytetramethylene glycol (PTMEG), poly(propylene glycol) PPG, 1,4-butane diol, ethylene glycol, diethylene glycol, or their mixtures. The term "substantially free of any diol" means that the curative component comprises 2,000 ppm or less or, preferably, 1,000 ppm or less of any diol.

In accordance with the CMP polishing pads of the present invention, the polishing layer comprises a reaction product wherein the stoichiometric ratio of the reactive hydrogen groups (defined as the sum of $NH_2$ and OH groups) in the curative component to the unreacted NCO groups in the isocyanate terminated urethane prepolymer ranges from 0.85:1 to 1.15:1, or preferably from 1.02:1 to 1.08:1.

In accordance with CMP polishing pads of the present invention, the CMP polishing pads have a polishing layer that has a specific gravity (SG) of from 0.4 to 1.15 or, preferably, from 0.6 to 1.1 or, more preferably, from 0.7 to 1.0.

In accordance with the CMP polishing pads of the present invention, the polishing layer is a reaction product which, when unfilled or lacking in added porosity, would have an SG of from 1.0 to 1.3 or, preferably, from 1.1 to 1.2.

In accordance with the CMP polishing pads of the present invention, the polishing layer comprises gas filled or hollow microelements, such as, preferably, polymeric microspheres from which the CMP polishing derives its porosity. Preferably, the amount of such gas filled or hollow microelements ranges from 0 to 5 wt. %, or, more preferably, from 1.5 to 3 wt. %, based on the solids weight of the polishing layer.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "lacking in added porosity" means that a CMP polishing pad of polishing layer thereof contains no gas filled or hollow microspheres or pores formed from addition of gas other than ambient air, such as nitrogen gas ($N_2$) or $CO_2$ or air under a pressure of greater than 1 atmosphere (101 kPa), to the reaction mixture.

As used herein, the term "number average molecular weight" of a polyol means the weight as determined by the product of its hydroxyl equivalent weight and the average number of hydroxyl groups per molecule. The hydroxyl equivalent weight is calculated from hydroxyl number, in mg KOH/g, as reported in a given manufacturer's specification or as determined by titration of the polyol according to ASTM D4274 (2011), using the following formula:

Hydroxyl equivalent weight=56100/hydroxyl number

As used herein, the term "polyisocyanate" means any isocyanate group containing molecule having three or more isocyanate groups, including blocked isocyanate groups.

As used herein, the term "polishing medium" as used herein and in the appended claims encompasses particle containing polishing solutions and non-particle containing polishing solutions, such as abrasive free and reactive liquid polishing solutions.

As used herein, the term "polyisocyanate prepolymer" means any isocyanate group containing molecule that is the reaction product of an excess of a diisocyanate or polyisocyanate with an active hydrogen containing compound containing two or more active hydrogen groups, such as diamines, diols, triols, and polyols.

As used herein, the term "Shore D hardness" is the hardness of a given material as measured according to ASTM D2240-15 (2015), "Standard Test Method for Rubber Property—Durometer Hardness". Hardness was measured on a Rex Hybrid hardness tester (Rex Gauge Company, Inc., Buffalo Grove, Ill.), equipped with a D probe. Six samples were stacked and shuffled for each hardness measurement.

As used herein, the term "specific gravity" or SG refers to the relative density of a given material to the density of water, as determined by weighing a known volume of the given material and dividing the result by the weight of the same volume of water, as measured according to ASTM D1622 (2014).

As used herein, unless otherwise indicated, the term "viscosity" refers to the viscosity of a given material in neat form (100%) at a given temperature as measured using a rheometer, set at an oscillatory shear rate sweep from 0.1-100 rad/sec in a 50 mm parallel plate geometry with a 100 μm gap.

As used herein, unless otherwise indicated, the term "wt. % NCO" refers to the amount as reported on a spec sheet or MSDS for a given NCO group or blocked NCO group containing product.

As used herein, the term "wt. %" stands for weight percent.

The present invention provides CMP polishing methods and chemical mechanical polishing pads that reduced defectivity and dishing in planarizing a metal surface, such as a copper metal surface in a semiconductor wafer. The chemical mechanical polishing pad of the present invention has a polishing layer that exhibits both a desirable balance of physical properties that correlates well with low defect polishing performance and conditionability to facilitate the formation of microtexture using a diamond conditioning disk, while maintaining a high polishing rate. Accordingly, the balance of properties enabled by the polishing layer of the present invention provides the ability to, for example, polish semiconductor wafers at an efficient rate without damaging the wafer surface by creating micro-scratch defects that could compromise the electrical integrity of the semiconductor device. It was surprising to find in CMP polishing a substrate containing a metal or metallized surface, the CMP polishing pad having a polishing layer of the present invention can improve defectivity and at the same time provide comparable or better dishing performance in planarizing or polishing a metal surface.

The CMP polishing pads of the present invention have a polishing layer wherein the water uptake of the unfilled polishing layer or polishing layer lacking in added porosity ranges from 4 to 8 wt. % after one week of soaking in deionized (DI) water at room temperature. The present inventors have found that such an unusually high water uptake enables defect free CMP polishing of metal or metallized substrates in accordance with the present invention with reduced dishing in the substrates. Further, the CMP polishing pads have a polishing layer that enable the methods of the present invention to succeed while using conventional CMP polishing methods.

The methods of the present invention for CMP polishing of a substrate preferably comprises: providing a chemical mechanical polishing apparatus having a platen; providing at least one substrate to be polished; providing a chemical mechanical polishing pad of the present invention; installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate, wherein at least some material is removed from the substrate; and, optionally, conditioning of the polishing surface with an abrasive conditioner. Preferably, in the method of the present invention, the chemical mechanical polishing apparatus provided further includes a light source and a photosensor (preferably a multisensor spectrograph); and, the chemical mechanical polishing pad provided further includes an endpoint detection window; and, the method further comprises: determining a polishing endpoint by transmitting light from the light source through the endpoint detection window and analyzing the light reflected off the surface of the substrate back through the endpoint detection window incident upon the photosensor.

The present invention provides methods of polishing a substrate, comprising: providing a chemical mechanical polishing apparatus having a platen; providing at least one substrate having a metal or metallized surface, such as one containing copper or tungsten; providing a chemical mechanical polishing pad according to the present invention; installing onto the platen the chemical mechanical polishing pad; optionally, providing a polishing medium at an interface between the polishing surface and the substrate; creating dynamic contact between the polishing surface and the substrate, wherein at least some material is removed from the substrate.

In accordance with the methods of the present invention for polishing a substrate, the at least one substrate is selected from the group consisting of at least one of a magnetic substrate, an optical substrate and a semiconductor substrate.

The CMP polishing methods of the present invention may be carried out in a conventional manner to create dynamic contact between the polishing surface of the polishing layer and the substrate, wherein a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. In polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

The present invention provides a CMP polishing pad, comprising: a polishing layer having a polishing surface, wherein the polishing surface is adapted for polishing a substrate selected from the group consisting of at least one of a magnetic substrate, an optical substrate and a semiconductor substrate. The polishing layer thus comprises both a surface macrotexture, such as one or more grooves, and a surface microtexture.

The polishing surface of the polishing layer of the chemical mechanical polishing pad of the present invention is adapted for polishing a substrate having a metal or metallized surface. Preferably, the polishing surface is adapted for polishing a substrate selected from at least one of a magnetic substrate, an optical substrate and a semiconductor substrate. More preferably, the polishing surface is adapted for polishing a semiconductor substrate.

To improve CMP polishing efficiency, the polishing layer of the CMP polishing pads of the present invention are provided with both macrotextures, such as perforations or grooves, and microtextures as are formed by a conditioning disk, as disclosed in U.S. Pat. No. 5,489,233.

Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, polishing layer of the chemical mechanical polishing pad of the present invention has a polishing surface with a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The CMP polishing pads in accordance with the present invention may be made by methods comprising: providing the isocyanate terminated urethane prepolymer; providing separately the curative component; and, combining the isocyanate terminated urethane prepolymer and the curative component to form a combination; allowing the combination to react to form a product; forming a polishing layer from the product, such as by skiving the product to form a polishing layer of a desired thickness and grooving the polishing layer, such as by machining it; and, forming the chemical mechanical polishing pad with the polishing layer.

The isocyanate terminated urethane prepolymer used in the formation of the polishing layer of the chemical mechanical polishing pad of the present invention preferably comprises: a reaction product of ingredients, comprising: a polyfunctional isocyanate and a prepolymer polyol.

Preferably, the polyfunctional isocyanate is selected from the group consisting of an aliphatic polyfunctional isocyanate, an aromatic polyfunctional isocyanate and a mixture thereof. More preferably, the polyfunctional isocyanate is a diisocyanate selected from the group consisting of 2,4-toluene diisocyanate; 2,6-toluene diisocyanate; 4,4'-diphenylmethane diisocyanate; naphthalene-1,5-diisocyanate; toluidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof.

Preferably, the prepolymer polyol is selected from the group consisting of diols, polyols, polyol diols, copolymers thereof, and mixtures thereof. More preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol is primarily (i.e., ≥90 wt %) PTMEG.

Preferably, the isocyanate terminated urethane prepolymer has an unreacted isocyanate (NCO) concentration of 8.5 to 9.5 wt % (more preferably, 8.75 to 9.5 wt %; still more preferably, 8.75 to 9.25; most preferably, 8.95 to 9.25 wt %). Examples of commercially available isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, the isocyanate terminated urethane prepolymer is a low free isocyanate terminated urethane prepolymer having less than 0.1 wt % free toluene diisocyanate (TDI) monomer content.

The curative component used in the formation of the polishing layer of the CMP polishing pad of the present invention contains a polyol curative and a polyfunctional aromatic amine curative, such as a difunctional curative.

Examples of commercially available polyol curatives include Specflex™ polyols, Voranol™ polyols and Voralux™ polyols (available from The Dow Chemical Company). A number of preferred polyol curatives are listed in Table 1A, below.

TABLE 1A

Polyols

| High molecular weight polyol curative | Number of OH groups per molecule | $M_N$ | Hydroxyl Number (mg KOH/g) |
|---|---|---|---|
| VORANOL ™ 5055H Polyol | 6.0 | 11,400 | 30 |
| VORANOL ™ 4053 Polyol | 6.9 | 12,420 | 31 |
| VORALUX ™ HF 505 | 6.0 | 11,400 | 30 |

Preferably, the difunctional curative is selected from diols and diamines. More preferably, the difunctional curative used is a diamine selected from the group consisting of primary amines and secondary amines. Still more preferably, the difunctional curative used is selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene, 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyldiamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Most preferably, the diamine curing agent used is selected from the group consisting of 4,4'-methylene-bis-(2-chloroaniline) (MbOCA); 4,4'-methylene-bis-(3-chloro-2,6-diethylaniline) (MCDEA); and, isomers thereof.

Preferably, the sum of the active hydrogen groups reactive hydrogen groups (i.e., the sum of the amine ($NH_2$) groups and the hydroxyl (OH) groups) contained in the curative component (i.e., the high molecular weight polyol curative and the difunctional curative) divided by the unreacted isocyanate (NCO) groups in the isocyanate terminated urethane prepolymer (i.e., the stoichiometric ratio) used in the formation of the polishing layer of the CMP polishing pad of the present invention is preferably 0.85:1 to 1.15:1 (more preferably 1.02:1 to 1.08:1; most preferably 1.04:1 to 1.06:1).

The polishing layer of the chemical mechanical polishing pad of the present invention may further comprises a plurality of microelements. Preferably, the plurality of microelements are uniformly dispersed throughout the polishing layer. Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the polishing layer. Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® microspheres from Akzo Nobel). Preferably, the plurality of microelements are incorporated into the polishing layer at 0 to 50 vol. % porosity (preferably 10 to 35 vol. % porosity). The vol. % of porosity is determined by dividing the difference between the specific gravity of an unfilled polishing layer and specific gravity of the microelement containing polishing layer by the specific gravity of the unfilled polishing layer.

The polishing layer of the CMP polishing pad of the present invention can be provided in both porous and nonporous (i.e., unfilled) configurations. Preferably, the polishing layer of the chemical mechanical polishing pad of the present invention exhibits a density of ≥0.4 g/cm³ as measured according to ASTM D1622-14 (2014). Preferably, the polishing layer of the chemical mechanical polishing pad of the present invention exhibits a density of 0.4 to 1.15 g/cm³ (more preferably, 0.70 to 1.0; as measured according to ASTM D1622 (2014)).

Preferably, the polishing layer of the chemical mechanical polishing pad of the present invention exhibits a Shore D hardness of 28 to 64 as measured according to ASTM D2240 (2015). More preferably, the polishing layer of the chemical mechanical polishing pad of the present invention exhibits a Shore D hardness of 30 to 60 (most preferably 35 to 55) as measured according to ASTM D2240 (2015).

Softer polishing layer materials tend to polish substrates at a lower rate than harder polishing layer materials. Notwithstanding, softer polishing layer materials tend to create fewer polishing defects than harder polishing layer materials. The unique curative component used in the formation of the polishing layer of the CMP polishing pad of the present invention provides reduced dishing without lowering removal rate.

Preferably, the polishing layer has an average thickness of 20 to 150 mils. More preferably, the polishing layer has an average thickness of 30 to 125 mils (still more preferably 40 to 120 mils; most preferably 50 to 100 mils).

Preferably, the CMP polishing pad of the present invention is adapted to be interfaced with a platen of a polishing machine. Preferably, the CMP polishing pad is adapted to be affixed to the platen of a polishing machine. Preferably, the CMP polishing pad can be affixed to the platen using at least one of a pressure sensitive adhesive and vacuum.

The CMP polishing pad of the present invention optionally further comprises at least one additional layer interfaced with the polishing layer. Preferably, the CMP polishing pad optionally further comprises a compressible base layer adhered to the polishing layer. The compressible base layer preferably improves conformance of the polishing layer to the surface of the substrate being polished.

An important step in substrate polishing operations is determining an endpoint to the process. One popular in situ method for endpoint detection involves providing a polishing pad with a window, which is transparent to select wavelengths of light. During polishing, a light beam is directed through the window to the substrate surface, where it reflects and passes back through the window to a detector (e.g., a spectrophotometer). Based on the return signal, properties of the substrate surface (e.g., the thickness of films thereon) can be determined for endpoint detection purposes. To facilitate such light based endpoint methods, the chemical mechanical polishing pad of the present invention, optionally further comprises an endpoint detection window. Preferably, the endpoint detection window is selected from an integral window incorporated into the polishing layer; and, a plug in place endpoint detection window block incorporated into the chemical mechanical polishing pad. One of ordinary skill in the art will know to select an appropriate material of construction for the endpoint detection window for use in the intended polishing process.

Preferably, the method of making a chemical mechanical polishing pad of the present invention, comprises: providing an isocyanate terminated urethane prepolymer having 8.5 to 9.5 wt. % (preferably, 8.95 to 9.25 wt. %) unreacted NCO groups; and, providing a curative component comprising: (i) from 60.3 to 70 wt. %, preferably, 60.5 to 67 wt. %, or, more preferably, 60.6 to 65 wt. %, based on the solids weight of the curative component, of a polyol curative, having a number average molecular weight of 6000 to 15,000, or, preferably, from 10,000 to 13,000 and an average of 5 to 7 or, preferably, 6 hydroxyl groups per molecule; and, (ii) providing from 30 to 39.7 wt. %, preferably, 33 to 39.5 wt. %, or, more preferably, 35 to 39.4 wt. %, based on the solids weight of the curative component, of a polyfunctional aromatic amine curative, such as a difunctional amine curative; combining the isocyanate terminated urethane prepolymer and the curative system to form a combination; allowing the combination to react to form a product; forming a polishing layer from the product; and, forming the CMP polishing pad with the polishing layer.

The methods of making a CMP polishing pad of the present invention may further comprise: providing a plurality of microelements; and, wherein the plurality of microelements is combined with the isocyanate terminated urethane prepolymer and the curative component to form the combination.

The method of making a CMP polishing pad of the present invention, optionally, further comprises: providing a mold; pouring the combination into the mold; and, allowing the combination to react in the mold to form a cured cake; wherein the polishing layer is derived from the cured cake. Preferably, the cured cake is skived to derive multiple polishing layers from a single cured cake. Optionally, the method further comprises heating the cured cake to facilitate the skiving operation. Preferably, the cured cake is heated using infrared heating lamps during the skiving operation in which the cured cake is skived into a plurality of polishing layers.

The method of making the CMP polishing pad of the present invention, optionally, further comprises: providing at least one additional layer; and, interfacing the at least one additional layer with the polishing layer to form the chemical mechanical polishing pad. Preferably, the at least one additional layer is interfaced with the polishing layer by known techniques, such as, by using an adhesive (e.g., a pressure sensitive adhesive, a hot melt adhesive, a contact adhesive).

The method of making the CMP polishing pad of the present invention, optionally, further comprises: providing an endpoint detection window; and, incorporating the endpoint detection window into the chemical mechanical polishing pad.

The present invention will now be described in detail in the following Examples.

EXAMPLES

Table 1 below summarizes compositions of a polishing layer of the present invention and a prior art example.

Prepolymer 1 comprises Adiprene™ L325 prepolymer having 8.95 to 9.25 wt. % unreacted NCO groups, made from toluene diisocyantae (TDI), polytetramethylene glycol (PTMEG), and 4,4'-methylene dicyclohexyl diisocyanate ($H_{12}$MDI) (Chemtura, Philadelphia, Pa.);

MbOCA is 4,4'-methylene-bis-(2-chloroaniline); and,

Voranol™ 5055HH polyol (Dow) has an average of 6 hydroxyl groups per molecule and a number average molecular weight of 11,400.

TABLE 1

| | | | CMP Polishing Layer Compositions | | | |
|---|---|---|---|---|---|---|
| | | | Curative Component | | | |
| EX. NO | Prepolymer | (% NCO) | Aromatic amine curative | (wt. %) | Polyol Curative | (wt. %) | Molar ratio (Curative/NCO) |
| 1C* | 1 | 9.1 | MbOCA | 53.5 | Voranol 5055HH | 46.5 | 1.05 |
| 1 | 1 | 9.1 | MbOCA | 39.2 | Voranol 5055HH | 60.8 | 1.05 |

*Denotes Comparative Example.

The formulations in Table 1 were cured at 104° C. for a period of 15.5 hours to make a bulk cured polishing layer material. Unfilled bulk materials (38 mm by 38 mm squares of 2 mm thick) were soaked in deionized (DI) water for one week. Water uptake was calculated by the percent weight change of each material. Pad hardness was measured before and after one week of water soaking, referred as dry and wet hardness, respectively. The wet hardness was measured on soaked samples after surface water had been removed. Sample hardness was recorded at both 2-seconds (2 s) and 15-seconds (15 s). Table 2, below summarizes water uptake and Shore D hardness measured before and after one week of water soaking.

TABLE 2

| | | \multicolumn{4}{c|}{Polishing Layer Properties} | | |

| Ex No. | SG, unfilled | Shore D hardness, 2 s dry | Shore D hardness, 15 s dry | Shore D hardness, 2 s, wet | Shore D hardness, 15 s, wet | Hard segment content | Water uptake, wt. % |
|---|---|---|---|---|---|---|---|
| 1C* | 1.15 | 61.7 | 58.8 | 54.7 | 49.2 | 42% | 3.4 |
| 1 | 1.14 | 54.1 | 50.1 | 46.0 | 37.2 | 36% | 5.0 |

*Denotes Comparative Example.

The hard segment content was calculated from the percentage hard segment in the polishing layer contributed mainly by the isocyanate component in the isocyanate terminated urethane prepolymer and the polyfunctional aromatic amine curative in the curative component. The balance was considered the soft segment, comprising mainly the prepolymer polyol used in making the isocyanate terminated urethane prepolymer and the polyol curative in the curative component.

To evaluate the polishing layers shown in Table 1, above, the polyurethane materials were skived to a thickness of 2 mm (80 mil) thick and were grooved in a circumferential K7 pattern (concentric circular groove pattern, with a groove pitch of 1.78 mm (70 mils), groove width of 0.51 mm (20 mils) and groove depth of 0.76 mm (30 mils)) to form a 775 mm (30.5 inch) diameter polishing layer; the polishing layer was then adhered to a SP2310™ sub-pad, commercially available from The Dow Chemical Company, Midland, Mich. The resulting CMP polishing pads were used with a commercial bulk copper slurry (CSL9044C colloidal silica abrasive particle slurry, Fujifilm Planar Solutions, Minato, Tokyo, Japan) at 300 ml/min to polish both copper sheet and pattern wafers. Polishing was conducted in an Applied Materials Reflexion™ LK 300 mm polisher. The CMP polishing pad was broken in with a Kinik I-PDA31G-3N conditioning disk (Taipei City, Taiwan, R.O.C.) at 2.27 kg (5 lbs) down force for 30 mins with DI water, with the platen rotating at 93 rpm and the conditioning disk rotating at 81 rpm. Following break in, the CMP polishing pad was used to polish 20 pcs of tetraethoxysilane (TEOS) oxide dummy wafers, before performance data was collected on three copper sheet wafers and one copper pattern wafer. Polishing the copper sheet and pattern wafers was performed with a polishing down force of 1.135 kg (2.5 psi), with the platen rotating at 93 rpm, and the wafer/carrier rotating at 87 rpm. After polishing, the substrate was cleaned with CX-100 cleaning solution (Wako Pure Chemical Industries, Ltd, Osaka, Japan). After cleaning, defectivity and dishing performance was determined.

Defectivity on Cu Sheet Wafers:

Defectivity was determined using Surfscan™ SP2 unpatterned wafer surface inspection tool (KLA-Tencor Corporation, Milpitas, Calif.) at a threshold 0.049 um. At 1.135 kg (2.5 psi) polishing down force, the average number of scratches in the polished copper sheet wafers are shown in Table 3, below.

TABLE 3

Polishing Defectivity Results

| Ex No. | Average scratch/chatter mark defect count |
|---|---|
| 1C* | 50.3 |
| 1 | 14.3 |

*Denotes Comparative Example.

The method of the present invention has demonstrated significantly improved defectivity performance than the methods of the Comparative Example 1C.

Dishing on Pattern Wafer:

Dishing during the polishing of a pattern wafer was evaluated using an end-point-detection (EPD) system to detect the endpoint for copper (Cu) film clearing (the end point of polishing). The EDP system detects a signal change as different film materials are exposed by polishing. An over-polish step was performed after the endpoint was detected to ensure the Cu film was cleared except inside the oxide trenches of the pattern wafer. The polish time of the over-polish step was set as a fixed percentage of the previous EPD time to achieve a similar over-polish amount in different wafers or different pads. After polishing, a Bruker AFM Probes™ tool (Billerica, Mass.) was used to measure dishing and topography at different feature sizes on the polished pattern wafer and to calculate total-indicated-range (TIR) using the tool's software. The dishing performance from Cu pattern wafer polishing is shown in Table 4, at feature sizes of both 100×100 μm and 50×50 μm.

TABLE 4

Dishing Performance

| Ex No. | Dishing improvement at 100 × 100 μm | Dishing improvement at 50 × 50 μm |
|---|---|---|
| 1C* | Control | Control |
| C | 18% | 12% |

*Denotes Comparative Example.

Table 4 shows substantial dishing improvement from the methods of the present invention when compared to the method of polishing using a CMP polishing pad made using less of the polyol curative of the present invention in Comparative Example 1C. It was unexpected that methods of polishing with a softer pad from in accordance with the present invention provides similar or better dishing than the methods of polishing with a harder pad as in Comparative Example 1C.

We claim:

1. A CMP polishing pad useful for polishing a metal surface on a semiconductor wafer, the CMP polishing pad comprising:
    a porous polishing layer, the porous polishing layer having a top polishing surface, the CMP polishing pad and porous polishing layer consisting essentially of: a cured reaction product of an isocyanate terminated urethane prepolymer, the isocyanate terminated urethane prepolymer being a blend of toluene diisocyanate, polytetramethylene glycol and 4,4'-methylene dicyclohexyl diisocyanate having 8.5 to 9.5 wt. % of unreacted NCO groups; and a curative component consisting essentially of from 60.3 to 70 wt. %, based on the solids weight of the curative component, of a polyol curative having a number average molecular weight of 6,000 to 15,000 and having an average of 5 to 7 hydroxyl groups per molecule; and from 30 to 39.7 wt. %, based on the solids weight of the curative component, of 4,4' methylene bis (2 chloroaniline), wherein a cured unfilled formulation of the CMP polishing pad lacking porosity, has a water uptake of 4 to 8 wt. % after one week of soaking in deionized (DI) water at room temperature and wherein the polishing layer having the porous top polishing surface has a Shore D hardness ranging of from 28 to 64 according to ASTM D2240 (2015), the top polishing surface being adapted for planarizing and polishing the metal surface of the semiconductor wafer.

2. The CMP polishing pad as claimed in claim 1, wherein the curative component of the polyol component is 60.6 to 65 wt %, based on the solids weight of the curative component.

3. The CMP polishing pad as claimed in claim 1, wherein the CMP polishing pad has a Shore D hardness of from 30 to 60.

4. The CMP polishing pad as claimed in claim 1, wherein the CMP polishing has a Shore D hardness of from 35 to 55.

5. The CMP polishing pad as claimed in claim 1, wherein the CMP polishing pad comprises CMP polishing stoichiometric ratio of reactive hydrogen groups (defined as sum of $NH_2$ and OH groups) in the curative component to the unreacted NCO groups in the isocyanate terminated urethane prepolymer ranges from 0.85:1 to 1.15:1.

6. The CMP polishing pad as claimed in claim 1, wherein the curative is substantially free of any diol.

7. The CMP polishing pad as claimed in claim 1, wherein the CMP polishing pad has a specific gravity (SG) of from 0.4 to 1.15 and the cured unfilled formulation of the CMP polishing pad has an SG of from 1.1 to 1.2.

8. The CMP polishing pad as claimed in claim 1, wherein the CMP polishing pad and porous polishing layer comprise gas filled or hollow microelements.

* * * * *